United States Patent
Hsu et al.

(10) Patent No.: US 7,015,089 B2
(45) Date of Patent: Mar. 21, 2006

(54) METHOD TO IMPROVE ETCHING OF RESIST PROTECTIVE OXIDE (RPO) TO PREVENT PHOTO-RESIST PEELING

(75) Inventors: Jyh-Shiou Hsu, Hsin-Chu (TW); Pin-Yi Hsin, Hsin Chu (TW); Chuan-Chieh Huang, Hsinchu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/289,761

(22) Filed: Nov. 7, 2002

(65) Prior Publication Data

US 2004/0092070 A1  May 13, 2004

(51) Int. Cl.
*H01L 21/8242* (2006.01)

(52) U.S. Cl. .................... 438/241; 438/258
(58) Field of Classification Search .......... 438/592, 438/682, 258, 241
See application file for complete search history.

(56) References Cited

U.S. PATENT DOCUMENTS

| | | | | |
|---|---|---|---|---|
| 5,863,820 A | * | 1/1999 | Huang | 438/241 |
| 5,891,771 A | * | 4/1999 | Wu et al. | 438/248 |
| 6,004,843 A | * | 12/1999 | Huang | 438/241 |
| 6,018,184 A | * | 1/2000 | Becker | 257/368 |
| 6,093,593 A | * | 7/2000 | Jang | 438/221 |
| 6,133,140 A | * | 10/2000 | Yu et al. | 438/624 |
| 6,258,497 B1 | * | 7/2001 | Kropp et al. | 430/30 |
| 6,294,448 B1 | * | 9/2001 | Chang et al. | 438/592 |
| 6,331,467 B1 | * | 12/2001 | Brown et al. | 438/270 |
| 6,333,256 B1 | * | 12/2001 | Sandhu et al. | 438/623 |
| 6,468,904 B1 | * | 10/2002 | Chen et al. | 438/682 |
| 6,696,334 B1 | * | 2/2004 | Hellig et al. | 438/230 |
| 6,762,127 B1 | * | 7/2004 | Boiteux et al. | 438/702 |

OTHER PUBLICATIONS

Wolf et al., Silicon Processing for the VLSI Era, vol. 1-Process Technology, Second Edition, 2000 Lattice Press pp. 128-129, 139-140.*
Ghandhi, VLSI Fabrication Principles, John Wiley & Sons, 1987, p. 518.*

* cited by examiner

Primary Examiner—Jennifer Kennedy

(57) ABSTRACT

An improved method of patterning resist protective dielectric layer and preferably protective silicon dioxide layer is described. The method consists of two sequential etching steps, the first one being a timed plasma etching process and the second one being a timed wet etching process. Plasma etching is used to remove approximately 70%–90% of the RPO film thickness and wet etching is used to remove the remaining 10%–30% of the film thickness. The two-step etching process achieves superior dimensional control, a non-undercut profile under the resist mask and prevents resist mask peeling from failure of adhesion at the mask/RPO film interface. The improved method has wide applications wherever and whenever RPO film is used in the process flow for fabricating semiconductor devices.

7 Claims, 4 Drawing Sheets

METHOD TO IMPROVE ETCHING OF RESIST PROTECTIVE OXIDE (RPO) TO PREVENT PHOTO-RESIST PEELING

BACKGROUND OF THE INVENTION (1) Field of the Invention

The present invention generally relates to etching of resist protective dielectric layer and specifically a protective silicon dioxide layer in the fabrication of a semiconductor device, that may be logic, memory, or a combination thereof.

(2) Description of the Prior Art

During the fabrication of a semiconductor device, parts of the device need to be protected while some other parts are processed. When, for example, memory and logic devices are fabricated on the same chip, electrical contacts on the logic part are made using the salicide (self aligned silicide) process. To enable the selective salicidation of the logic side components, the memory part of the chip is protected by resist protective oxide (RPO) and masked with a resist mask. Another example is the fabrication of a chip with a field effect transistor (FET) device and I/O circuitry provided on the same chip. While forming electrical contacts to the FET elements such as source, drain, and gate with the salicidation process, the I/O part of the chip is protected from several process steps with an RPO film. In all these applications, an RPO film is first deposited and then a resist mask is formed over those areas of the chip that need to be protected from some of the subsequent process steps. The RPO film is then etched in the exposed areas of the chip. RPO etching process is critical, depending upon the application since other oxide films in the unmasked areas of the chip get attacked as well. When wet etching is used, the process will produce undercut profiles near the edge of the resist mask, resulting in poor dimensional control and resist mask peeling and mask lift-off. Resist peeling problems become even more severe as the ground rule dimensions (e.g. line width and spacing) shrink to less than 0.25 $\mu$m, with large sections on the wafer floating off during the rinsing step following the etching step.

U.S. Pat. No. 5,863,820 describes a process and structure with both logic and memory devices fabricated on the same chip. Electrical contacts to the memory device are made using a self aligned contact (SAC) process, while the logic device contacts are made with the salicide process. The two processes are integrated within a single chip by first forming poly silicon gate pedestals. Next, oxide or nitride spacers are grown on the vertical side of the gate. Source/drain regions are then formed followed by a coating of RPO film on the memory part of the chip. The RPO film allows selective application of the salicidation process to the logic part only.

U.S. Pat. No. 5,891,771 describes a shallow trench isolated recessed structure that has a low probability of short-circuiting at the silicon to trench interface or between source or drain and the gate. An isolation trench structure having a top portion with vertical sides and a lower portion with sloping sides is first formed. With filled trench along with a poly-silicon gate and gate oxide, the thinner lightly doped N-silicon layer is formed using ion implantation. Spacers are then formed on the gate prior to the second implantation step and a thin layer of silicon is selectively removed from the surface. This causes the trench filler material to extend above the wafer surface and the spacers to extend above the gate by the amount of silicon removed. A deeper, more strongly N-type silicon is formed, followed by standard silicidation process using the standard RPO process steps.

U.S. Pat. No. 6,093,593 describes a method of forming a gate that provides reduced recess in adjacent shallow trench isolation (STI). The process begins by forming shallow trench isolation structure on a silicon surface that separates a cell area from an I/O area on a chip. A gate is formed in the cell area adjacent to STI. Impurity ions are implanted into the semiconductor surface adjacent to the gate to form source/drain regions. A resist protective oxide (RPO) layer, having a greater porosity than the oxide filled in STI structure, is then deposited. The RPO is then patterned to form a protective mask over the I/O area, thereby exposing the cell area of the chip. Since RPO has higher etch rate than STI-filled oxide due to higher porosity, very little corner recessing of the STI structure takes place. Silicide contacts are then formed in the usual way. RPO patterning is done with a wet etching process using an aqueous solution of $NH_4$ and HF.

U.S. Pat. No. 6,294,448B1 describes a method to form silicided layers over points of electrical contacts. According to the method, a MOSFET gate electrode is formed, including LDD regions, gate-spacers and source/drain regions. A layer of resist protective oxide (RPO) is deposited over the structure and patterned, leaving the RPO in place where the silicided layers are not to be formed, leaving the surfaces over the source/drain and gate electrode regions exposed. An additional As or B implant is done into the surface of the exposed regions followed by conventional salicidation process. The patent does not describe the RPO etching step except saying it is time-mode dry etching process.

In all the referenced patents, RPO is made use of for selective processing of specific areas of the silicon chip. However, patterning of RPO is not the main objective of these patents. In most cases, RPO patterning is done by a wet etching process with inherent disadvantages listed before. Only in U.S. Pat. No. 6,294,448B1, dry etching is mentioned but as a single step process, with no elucidation of the process. No solutions are proposed in these references on overcoming the disadvantages related to RPO patterning by the single step wet etching or dry etching processes in the prior art.

SUMMARY OF THE INVENTION

Accordingly, the main object of this invention is to describe an improved method of etching a resist protective dielectric film and in particular a silicon dioxide (RPO) film.

It is yet another objective to describe a resist protective oxide etching process that prevents peeling of the photo-resist mask during RPO patterning.

In accordance with these objectives an improved method is described to pattern an RPO film during the fabrication of a semiconductor memory and/or logic device. The semiconductor device elements are formed on a silicon substrate up to a stage where process steps are common to all parts of the chip. A resist protective oxide layer is then deposited on the wafer. A photolithographic mask is then defined to leave the resist in those areas of the chip that require protection from some of the subsequent process steps. The RPO film in other areas of the chip with no resist mask is then etched using a hybrid etching process having a dry plasma etching step and a wet etching step. The first highly anisotropic plasma etching process is used to etch most of the RPO film and the residual film is etched to completion with a suitable wet etching process like dilute hydrofluoric acid or buffered hydrofluoric acid. The parts of the chip where RPO is removed are then processed to completion.

BRIEF DESCRIPTION OF THE DRAWINGS

FIG. 1 is a cross-sectional view of resist protective silicon dioxide layer with photo-resist pattern.

FIG. 2 is a cross-sectional view of RPO pattern after first-step plasma etching.

FIG. 3 is a cross-sectional view of RPO pattern after second-step wet etching.

FIG. 4 is a cross-sectional view of a semiconductor device with logic and memory components formed on the same chip, showing gate structures with sidewall spacers, source/drain, and LDD regions.

FIG. 5 is a cross-sectional view of the semiconductor device of FIG. 1 after resist protective oxide has been deposited over the entire wafer.

FIG. 6 is a cross-sectional view of the semiconductor device showing the resist mask formed over the memory part of the chip.

FIG. 7 is a cross-sectional view of the semiconductor device after the RPO has been etched according to prior art.

FIG. 8 is a cross-sectional view of the semiconductor device after the RPO has been etched with the invention process.

FIG. 9 is a cross-sectional view of the completed semiconductor device, showing electrical contacts on the logic and memory parts of the chip.

DETAILED DESCRIPTION OF THE INVENTION

Although the process of the invention is and can be used wherever and whenever RPO film is used in the fabrication of a semiconductor device, the invention is described here using an application where logic and memory components are fabricated on the same chip. In this application, electrical contacts are formed in the logic part using self-aligned silicide or salicide contacts; and in the memory part of the chip, these contacts are formed using contact holes etched to the diffused regions of silicon.

Figure 1:
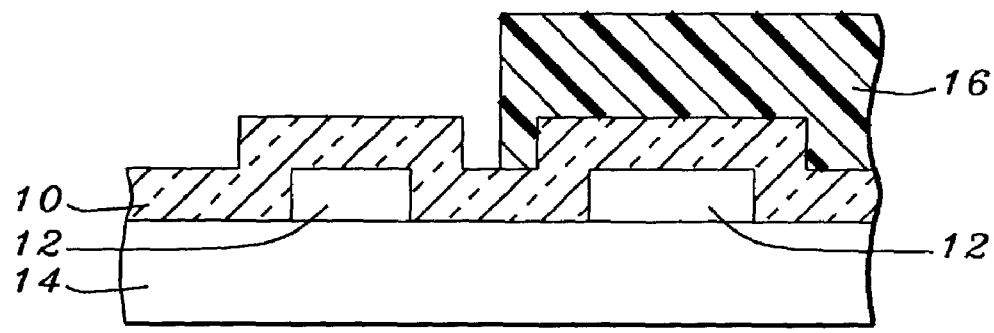
FIGS. 1–3 are cross-sectional views of the process flow of the invention in its general embodiment.

A resist protective dielectric film 10, which is preferably silicon dioxide, is deposited over device components 12 formed in a chip on a silicon substrate 14. Examples of alternate dielectric films that can be used are silicon nitride, silicon oxy-nitride, oxygen-doped silicon nitride, and/or nitrided oxides. Resist mask 16 is then formed over the part of the chip that needs protection from subsequent process steps. The structure is shown in FIG. 1.

Figure 2:
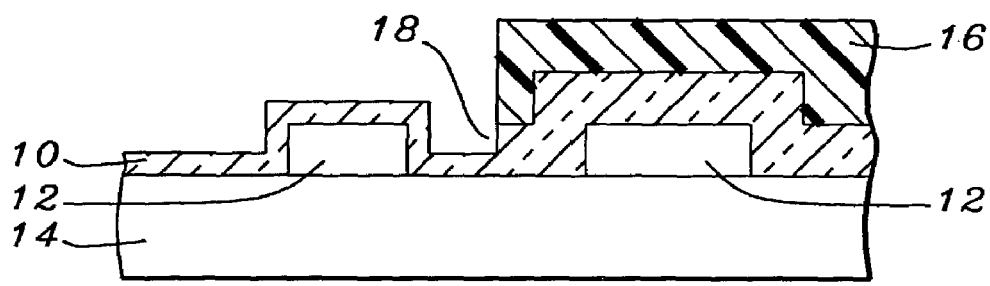

The RPO layer 10 is etched in the first step by a plasma process such that about 70–90% of the RPO film thickness is removed. The plasma process, known in the prior art, is one that achieves high degree of anisotropy in the etched profile 18, as shown in FIG. 2.

Figure 3:
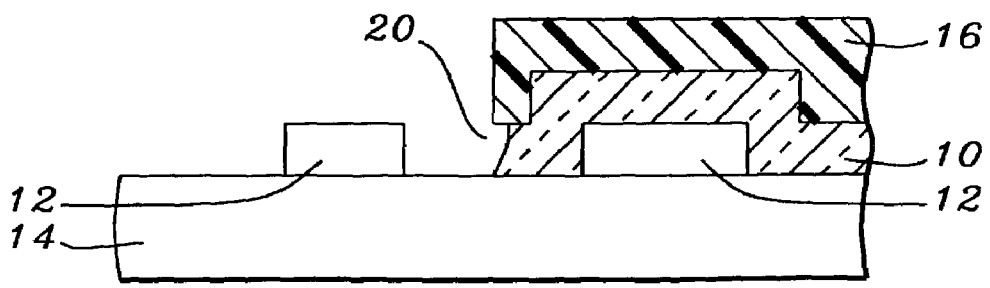

The remaining 20%–30% of the RPO film is then etched, which can be a timed etch, in wet etchant like dilute HF or buffered HF solution, known in prior art. Although the profile 20 is isotropic in this step due to the inherent nature of wet etching, due to small thickness of the film, the overall profile 22 predominantly remains nearly vertical, as shown in FIG. 3.

Figure 4:
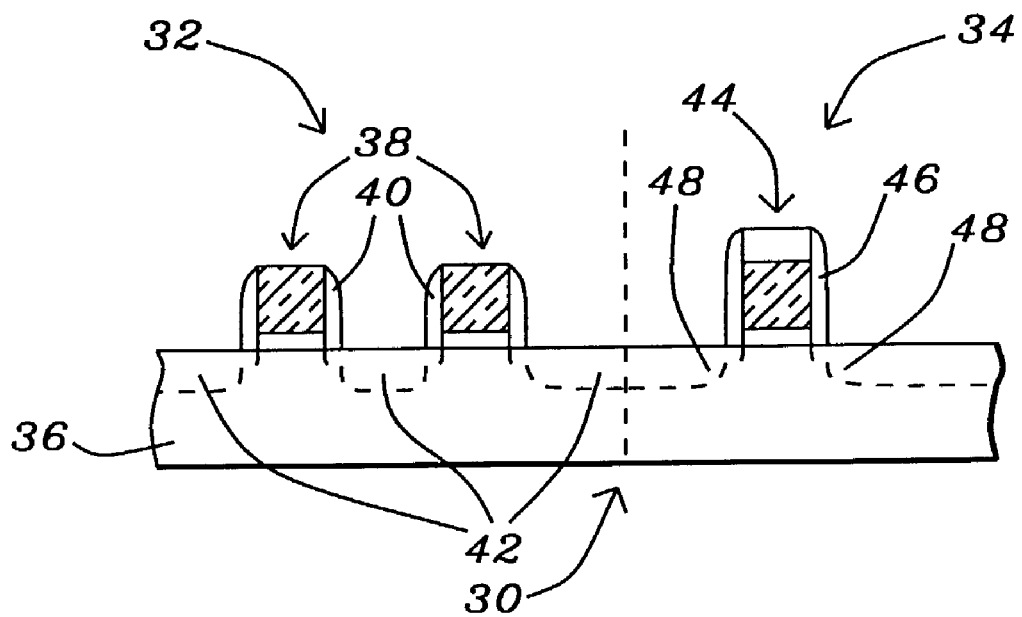
FIGS. 4–9 are cross-sectional views of a specific application where the invention process for patterning RPO is used.
Figure 5:
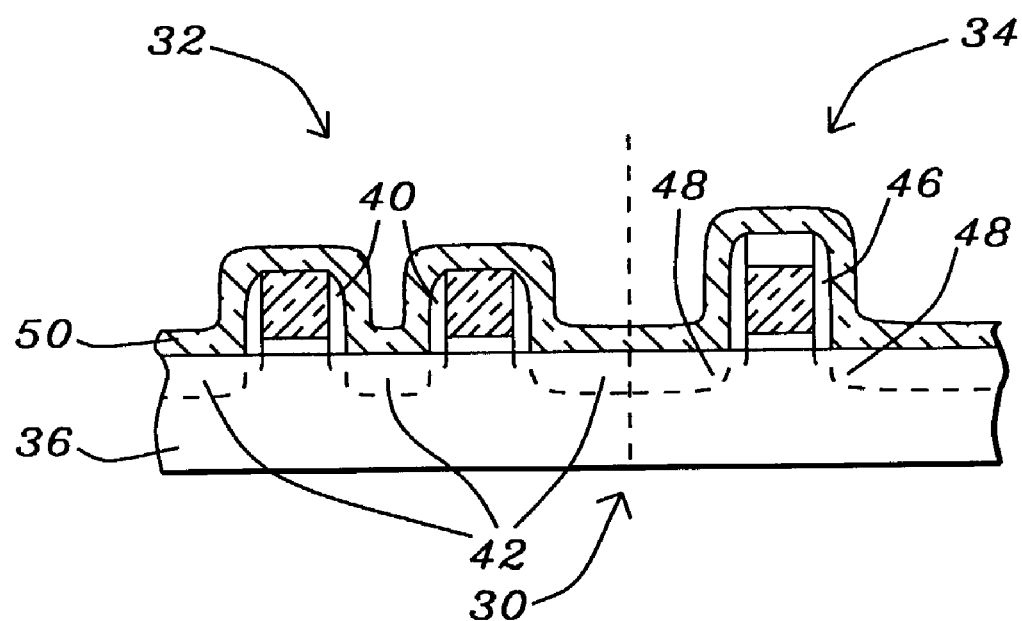

In FIG. 4 is shown a partially fabricated device 30 having both logic part 32 and memory part 34 designed on chip 36. Gates 38 with sidewall spacers 40 and source/drain regions 42 in the logic part; and gates 44 with sidewall spacers 46 and source/drain regions 48 in the memory part are also shown Since electrical connections in the logic side are made with salicided contacts, the memory part of the chip needs to be protected during various steps of the silicidation process. To accomplish selective silicidation, a thin layer, in the range of about 100–500 Å of a suitable dielectric film, preferably a silicon dioxide film 50, is deposited using deposition processes known in the prior art. Suitable alternate dielectric films are silicon nitride, silicon oxy-nitride, oxygen-doped silicon nitride, and/or nitrided oxides. Device structure after RPO deposition is shown in FIG. 5.

Figure 6:
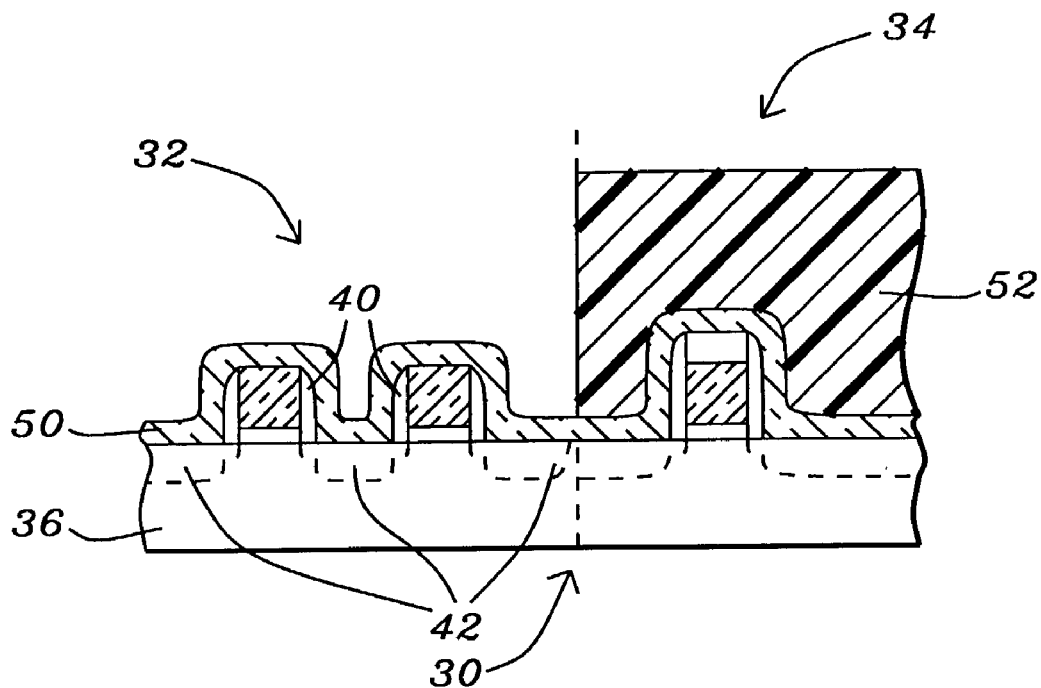

In FIG. 6 is shown a photo-resist mask 52 formed only over the memory part of the chip, using lithographic processes known in the prior art.

Figure 7:
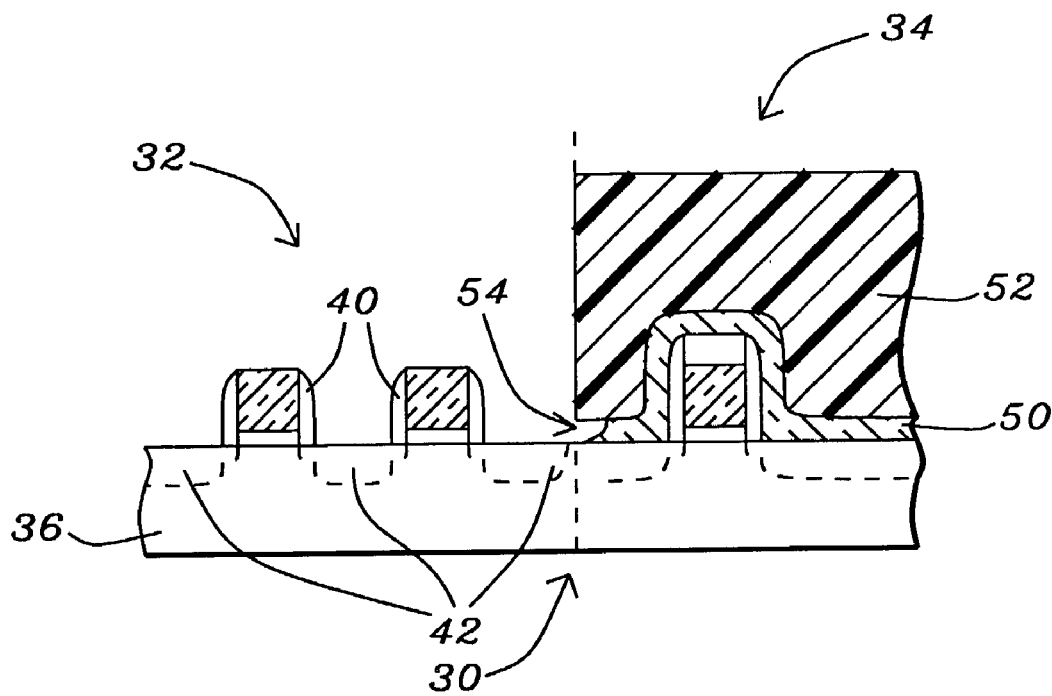

In FIG. 7 is shown the device structure after etching the RPO film according to prior art of wet etching process. When wet etching, which is inherently isotropic in nature, is employed, an undercut profile 54 is produced under the resist mask. Excessive undercuts are also possible when HF etching times are long. Particularly when the device dimensions and spacing are small, in the sub-0.25 μm range, even small undercuts can produce resist peeling and lift-off due to poor adhesion between the resist mask and RPO film at the interface. Resist peeling in turn will cause RPO etching in unwanted memory regions of the chip resulting in loss of process yield.

Figure 8:
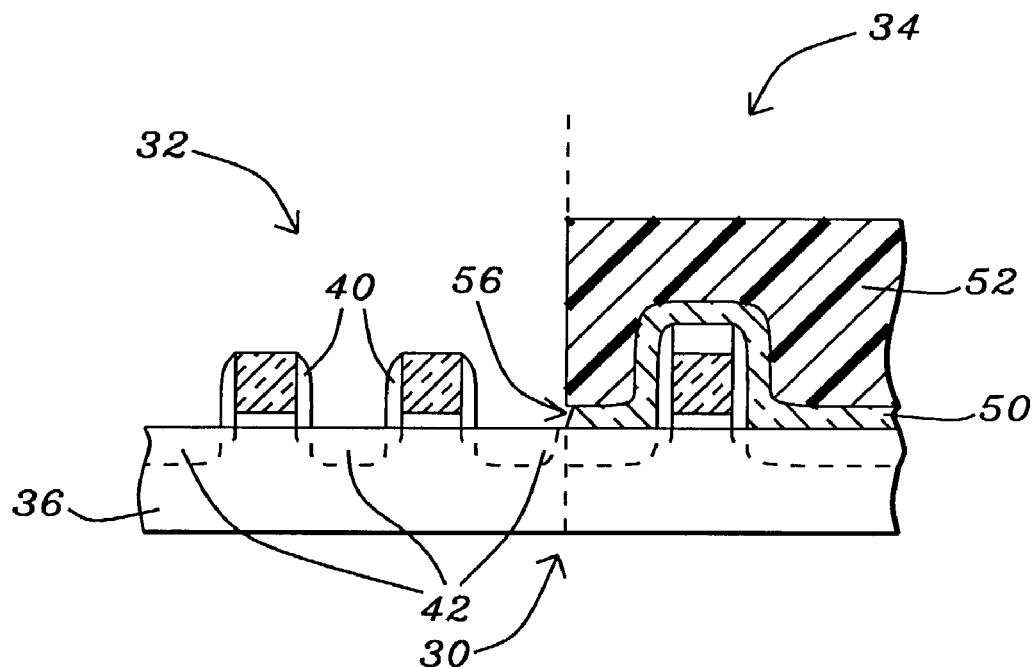

However in the invention process, a hybrid process is used to etch the RPO film. First a highly anisotropic plasma etching process known in the prior art is used to etch most of the RPO film. A typical process uses gaseous plasma of gases like CF4+CHF3, C5F8, and/or C4F8 with additive gases like N2, Ar, and/or O2. The etching reactors used may be parallel plate type with or without enhancement by magnetic fields or electron cyclotron resonance (ECR) type available commercially. Process recipe used in our experiments was: 400 watts RF power, 80 mtorr pressure, and a gas mixture of 10 sccm CF4+90 sccm CHF3+80 sccm Ar, with an etch time of approximately 15 sec. After timed plasma etching, the remaining RPO is etched using dilute HF solution and/or an aqueous buffered HF solution, both known in the prior art. RPO wet etching was done on a wet bench tool in a 50:1 UF solution at approximately 20–25° C. Plasma etching produces a non-undercut profile with superior dimension control whereas the final brief wet etching process achieves high selectivity to the underlying film and the resist mask. The resultant RPO etch profile 56 with the hybrid invention process is shown in FIG. 8.

Figure 9:
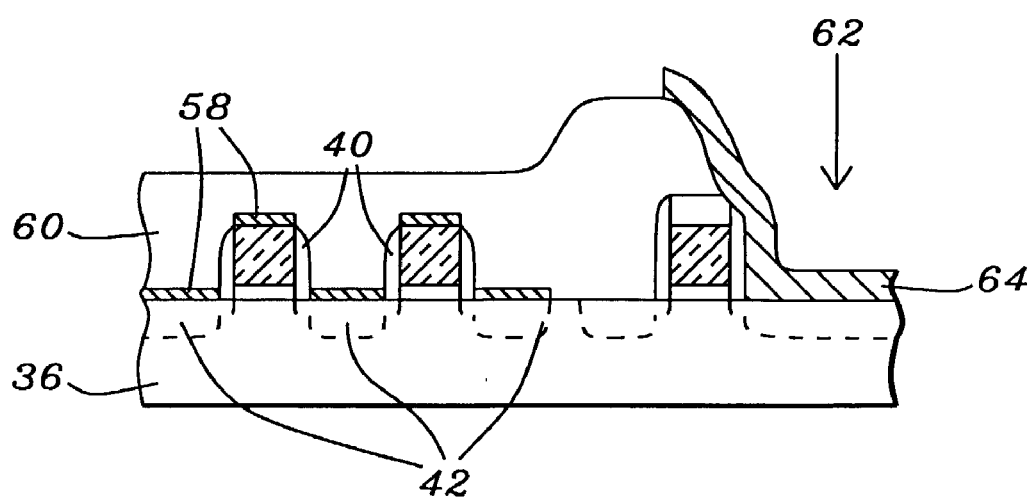

FIG. 9 shows the completed device cross-section showing silicide electrical contacts 58 in the logic part and contact hole 62 with tungsten contact metal 64 in the memory part of the chip 36. The process steps leading to the formation of electrical contacts of the device structure of FIG. 9 are briefly discussed here, being known in the prior art. After RPO etching and mask removal, silicide-forming metals like titanium is deposited over the whole wafer, annealed to form silicide 58 on exposed silicon areas, selectively etched to remove non-silicided areas, thereby forming silicided electrical contacts only in the logic part of the chip. A layer of oxide 60 is now deposited over the whole wafer, a mask is formed to provide contact hole-pattern only over the memory part of the chip, and contact holes 62 etched to form electrical contacts 64 to source/drain regions.

The advantages of the invention over prior art are:
   a) Two etching methods are used that complement each other in their unique characteristics. Plasma etching, as described before, achieves non-undercut profiles thereby maintaining superior dimensional control. Wet etching, described before, is superior in achieving high mask-to-RPO and RPO-to-underlying film selectivity.

b) Short wet etching produces the least amount of undercut or lateral etching, thereby facilitating in maintaining good adhesion between the resist mask and RPO film, preventing mask peeling.

c) Plasma etching most of the RPO film and wet etching to remove the remaining thin residual film achieves the most optimal results with high process yield.

While the invention has been particularly shown and described with reference to the general embodiment and a specific application thereof, it will be understood by those skilled in the art that various changes in form and details to the method and applications may be made without departing from the concept, spirit, and the scope of the invention.

What is claimed is:

1. A method of patterning a silicon dioxide layer comprising:

forming at least first and second components on a substrate;

forming a silicon dioxide layer having a thickness over said first and second components and at least a portion of said substrate;

forming a partial mask over said first and second components;

patterning said silicon dioxide layer with a two step etching process, the first etching step removing a first portion of the silicon dioxide layer thickness and the second etching step removing a second portion of the silicon dioxide layer thickness; wherein the first etching step is a timed anisotropic etch and removes a sufficient portion of the thickness of the silicon dioxide layer to prevent substantial undercutting of the silicon dioxide layer beneath the partial mask during the second etching step; and rinsing the semiconductor structure;

wherein the second etch step is an isotropic wet etch, and wherein said preventing substantial undercutting of the silicon dioxide layer beneath the partial mask prevents mask peeling during the rinsing step;

wherein said first etching step is a plasma process or a reactive ion etching process; and wherein said first etching step is used to etch about 70%–90% of the thickness of said silicon dioxide layer.

2. The method of claim 1, wherein said silicon dioxide layer has a thickness of about 100–500 Angstroms (Å).

3. The method of claim 1, wherein said second etching step is used to etch about 20%–30% of said silicon dioxide layer.

4. A method of patterning a silicon dioxide layer comprising:

forming at least first and second components on a substrate;

forming a silicon dioxide layer having a thickness over said first and second components and at least a portion of said substrate;

forming a partial mask over said first and second components;

patterning said silicon dioxide layer with a two step etching process, the first etching step removing a first portion of the silicon dioxide layer thickness and the second etching step removing a second portion of the silicon portion thickness; wherein the first etching step is a times anisotropic etch and removes a sufficient portion of the thickness of the silicon dioxide layer to prevent substantial undercutting of the silicon dioxide layer beneath the partial mask during the second etching step; and rinsing the semiconductor structure;

wherein the second etch step is an isotropic wet etch, and wherein said preventing substantial undercutting of the silicon dioxide layer beneath the partial mask prevents mask peeling during the rinsing step;

wherein said second etching step is a wet etching process; and wherein said second etching step is used to etch about 20%–30% of the thickness of said silicon dioxide layer.

5. The method of claim 4, wherein the first etching step of said silicon dioxide layer is a plasma etching process or a reactive ion etching process.

6. The method of claim 4, wherein said first etching step is used to etch about 70%–90% of the thickness of the silicon dioxide layer.

7. The method of claim 4, wherein said silicon dioxide layer has a thickness of approximately about 100–500 Å.

* * * * *